(12) United States Patent
Reverchon et al.

(10) Patent No.: US 11,482,563 B2
(45) Date of Patent: Oct. 25, 2022

(54) HYBRID OPTICAL/ELECTRONIC SYSTEM

(71) Applicants: THALES, Courbevoie (FR); COMMISSARIAT A L'ENERGIE ATOMIQUE ET AUX ENERGIES ALTERNATIVES, Paris (FR)

(72) Inventors: Jean-Luc Reverchon, Palaiseau (FR); Florian Le Goff, Palaiseau (FR)

(73) Assignees: THALES, Courbevoie (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 230 days.

(21) Appl. No.: 16/763,549

(22) PCT Filed: Nov. 13, 2018

(86) PCT No.: PCT/EP2018/081093
§ 371 (c)(1),
(2) Date: May 12, 2020

(87) PCT Pub. No.: WO2019/096794
PCT Pub. Date: May 23, 2019

(65) Prior Publication Data
US 2020/0365631 A1    Nov. 19, 2020

(30) Foreign Application Priority Data
Nov. 14, 2017    (FR) ...................................... 1701175

(51) Int. Cl.
*H01L 27/146*    (2006.01)

(52) U.S. Cl.
CPC .... *H01L 27/1469* (2013.01); *H01L 27/14634* (2013.01); *H01L 27/14694* (2013.01); *H01L 27/1465* (2013.01)

(58) Field of Classification Search
CPC ........... H01L 27/1469; H01L 27/14634; H01L 27/1465
See application file for complete search history.

(56) References Cited

U.S. PATENT DOCUMENTS 8,519,459 B2 * 8/2013 Horiike ................. H04N 5/374
257/E23.141
8,890,331 B2 * 11/2014 Shimotsusa ....... H01L 27/14687
257/431

(Continued)

FOREIGN PATENT DOCUMENTS

WO    2013/079603 A1    6/2013
WO    2017/037527 A1    3/2017

*Primary Examiner* — David A Zarneke
(74) *Attorney, Agent, or Firm* — BakerHostetler

(57) ABSTRACT

A hybrid optical and/or electronic system includes a first planar structure having a first functionality and made of at least one first material, and a second planar structure having a second functionality and made of at least one second material different from the first material, the first and second planar structures being assembled by an assembly layer, at least one of the planar structures being disposed on a rigid substrate, the system comprising at least one active zone used for implementing the functionalities, and at least one neutral zone not used to implement the functionalities and disposed at the periphery of the active zone, the system also comprising recesses made in at least one neutral zone of the planar structure which is not disposed on the rigid substrate and is referred to as hollowed-out planar structure.

25 Claims, 19 Drawing Sheets

(56) References Cited

U.S. PATENT DOCUMENTS

| | | | |
|---|---|---|---|
| 9,123,615 B2* | 9/2015 | Lin | H01L 27/14685 |
| 9,559,135 B2* | 1/2017 | Li | H01L 27/1464 |
| 9,865,581 B2* | 1/2018 | Jang | H01L 24/08 |
| 10,038,026 B2* | 7/2018 | Huang | H01L 27/1469 |
| 10,665,632 B2 | 5/2020 | Reverchon et al. | |
| 2016/0307946 A1 | 10/2016 | Huang et al. | |
| 2017/0221951 A1 | 8/2017 | Zheng et al. | |

\* cited by examiner

HYBRID OPTICAL/ELECTRONIC SYSTEM

CROSS-REFERENCE TO RELATED APPLICATIONS

This application is a National Stage of International patent application PCT/EP2018/081093, filed on Nov. 13, 2018, which claims priority to foreign French patent application No. FR 1701175, filed on Nov. 14, 2017, the disclosures of which are incorporated by reference in their entirety.

FIELD OF THE INVENTION

The invention relates to hybrid systems, that is to say systems composed of two distinct parts assembled by an assembly layer, each part being produced in a different material. These systems can be optical, electronic or optoelectronic according to the features of the assembled parts. The invention relates particularly to the improvement of the performance of the assembly layer of a hybrid system.

BACKGROUND

Hybrid systems make it possible to associate two functionalities produced in different materials. They can be, for example:
a detector, in which the sensitive part is associated with a read-out circuit making it possible to collect and process the signal to be detected,
a display, for example of light-emitting type, wherein the emitting part is associated with a circuit for generating electrical signals suitable for emission,
a photonic circuit, with laser emitters associated with layers for processing the emitted beams (guiding, multiplexing/demultiplexing, amplification, etc.), the processing layer or layers being deposited on a silicon substrate ("Photonic on Silicon"),
an electronic circuit having fast or power transistors associated with a control system.

The first two hybrid systems can be qualified as optoelectronic, the third can be purely optical or optoelectronic, while the fourth is purely electronic.

Generally, the hybrid systems HS are produced as described in FIG. 1.

At the outset, there is a first part P1 ensuring a first functionality, for example detection or emission, produced on one (or several) first materials M1 on a substrate Sub1, and a second part P2 ensuring a second functionality, for example a circuit on silicon making it possible to read or generate electrical signals, produced in a second material M2 that is different from the first material M1 and supported by a substrate Sub2. These two parts are produced independently. On each of them, a layer of a material M3 is disposed which will be used to perform the assembly. These two parts are of planar structure, and have a "large surface area", that is to say typically 1 mm$^2$ or more.

Then, the two parts are assembled with one another by an assembly method, the material M3 making it possible to form the assembly layer 11. This step is also called hybridation.

One rapidly expanding assembly technique is bonding. It constitutes a significant advance for performing so-called "above IC" technological steps, that is to say steps that can be performed directly on the wafer of the circuit forming one of the parts, typically of CMOS type, and collectively on all of the chips. This compatibility with the CMOS fabrication means lends itself to a significant lowering of the production costs and the possibility of achieving technological patterns of thinner size.

One example of bonding is molecular bonding. This method consists in specifically preparing the surface of the two parts with, as M3, a deposition of a dielectric material, particularly of silica, then performing planarizations. They are then placed in mechanical contact, then a thermal curing (of the order of 200° C.) is performed. The final assembly layer 11, for example of SiO$_2$, has a thin thickness, typically from a few tens of nm to a few µm.

It is also possible to use epoxy on one of the parts then proceed with the assembly.

Once the assembly is complete, then, generally, one of the substrates is eliminated. In some cases, the remaining substrate is also removed, to replace it with a destination substrate Subd, that is less expensive and/or that has better mechanical or other properties (low dielectric losses).

The assembly step is a high-risk step, and the inventors have highlighted certain negative effects induced by the bonding on hybrid detectors.

SUMMARY OF THE INVENTION

One aim of the present invention is to remedy the above-mentioned drawbacks by proposing a hybrid system that offers enhanced assembly quality.

The subject of the present invention is a hybrid optical and/or electronic system comprising:
a first planar structure having a first functionality produced in at least one first material and
a second planar structure having a second functionality produced in at least one second material that is different from the first material,
the first planar structure and the second planar structure being assembled by an assembly layer, at least one of the planar structures being disposed on a rigid substrate,
the system comprising at least one active zone used to implement said functionalities, and at least one neutral zone not used to implement said functionalities and disposed at the periphery of said active zone,
the system further comprising recesses produced in at least one neutral zone of the planar structure which is not disposed on the rigid substrate, called recessed planar structure.

Preferentially, a depth of a recess is such that a bottom of said recess is disposed at a distance from the assembly layer that is less than 1 µm.

According to one embodiment, the recesses take the form of holes or of furrows.

According to one embodiment, the recesses are covered with a metallic layer.

Preferentially, the material of the recessed planar structure has a thermal expansion coefficient greater than the thermal expansion coefficient of the other planar structure.

According to one embodiment, the recessed planar structure has a thickness less than 20 µm.

Preferentially, the assembly is done by molecular bonding.

Preferentially, a surface area of the at least one active zone is greater than or equal to 1 mm$^2$.

According to a first variant, the invention relates to an optoelectronic detection system as claimed in one of the preceding claims comprising a matrix of pixels,
wherein the first functionality is a pixelized photogeneration of carriers, the first structure comprising a plurality of layers including an absorbent layer made of II-VI or III-V semiconductor material, wherein the second functionality is a read-out of an electrical signal generated by a pixel, the second structure comprising a read-out circuit comprising a plurality of buried contacts, and wherein the at least one active zone comprises said matrix of pixels and the at least one neutral zone is disposed at the periphery of said matrix of pixels.

Preferentially, the first structure comprises, in at least one layer, a plurality of doped zones configured to collect carriers photogenerated by the absorbent layer, a doped zone making it possible to define a pixel of the detection system, wherein the electrical signal is generated by a pixel from said carriers photogenerated by the absorbent layer, an electrical connection between a doped zone and a buried contact of the read-out circuit being produced by metallized interconnection holes, and wherein the recessed planar structure is that which is passed through by the interconnection holes.

According to a first embodiment, the second structure is disposed on the rigid substrate, wherein the interconnection holes pass through the first structure and the read-out circuit to the contact, wherein each doped zone extends annularly around an interconnection hole, the recessed planar structure being the first planar structure.

Preferentially, a depth of a recess is such that said recess does not reach the read-out circuit.

Preferentially, the recesses are produced in the neutral zone disposed between a common contact and the contact pads of said system.

According to one embodiment, a first plurality of recesses are interconnected with one another so as to form a test pad and a second plurality of recesses are linked to one another and to said common contact of the matrix of pixels.

According to a second embodiment, the first planar structure is disposed on the rigid substrate, said rigid substrate being transparent, each doped zone (DZ) is produced in a contact layer (CL) disposed under the absorbent layer (AL), the second planar structure (S2) is disposed on a thinner substrate (Sub'), the interconnection holes (IH) pass through the thinner substrate (Sub') and the second planar structure (S2), the recessed planar structure being the second planar structure, the recesses being produced in the thinner substrate Sub' and the second planar structure S2.

According to a second variant, the invention relates to an optoelectronic display system comprising a matrix of light-emitting pixels, wherein the first functionality is a pixelized emission, the first planar structure comprising a plurality of layers including a light-emitting layer, wherein the second functionality is a generation of electrical signals suitable for producing the light-emission, the second planar structure comprising an addressing circuit for the pixels deposited on a silicon substrate, and wherein the at least one active zone comprises said matrix of pixels which is and the at least one neutral zone is disposed at the periphery of said matrix of pixels, the recessed structure corresponding to the first planar structure.

According to a third variant, the invention relates to an electronic system wherein the first planar structure comprises a plurality of transistors and the second planar structure comprises circuits associated with said transistors, and wherein the at least one active zone comprises said transistors and the at least one neutral zone is disposed at the periphery of said transistors, the recessed structure corresponding to the first planar structure.

Preferentially, for the second and third variants, the system further comprises interconnection vias CV in the active zone.

According to another aspect, the invention relates to a method for fabricating a hybrid optical and/or hybrid electronic system, the method comprising the steps of:

assembling, by an assembly layer, a first planar structure having a first functionality produced in at least one first material, the first structure being deposited on a first substrate, and a second planar structure having a second functionality produced in at least one second material that is different from the first material, the second structure being deposited on a second substrate, the first and second assembled structures comprising at least one active zone used to implement said functionalities, and at least one neutral zone not used to implement said functionalities, detaching one of the substrates so as to retain only a single rigid substrate, producing recesses in at least one neutral zone of the planar structure which is not disposed on the rigid substrate, called recessed planar structure (Se).

DRAWINGS

Other features, aims and advantages of the present invention will become apparent on reading the following detailed description and in light of the attached drawings given by way of nonlimiting examples and in which:

FIG. 1, already cited, illustrates a method for producing a hybrid system according to the state of the art.

FIG. 3 illustrates the principle of the method for producing a detector of "loop hole" type.

DETAILED DESCRIPTION

The inventors have studied in particular the hybrid detectors that use interconnection vias to connect the detection elements and the read-out circuit. This study has made it possible to highlight the appearance of "bubbles" and, following the analysis of this phenomenon, to propose a solution that makes it possible to eliminate them.

Two types of hybrid detectors with interconnection vias based on a III-V technology are described below. They operate in the infrared range and are constructed by the assembly of a matrix comprising a plurality of elementary pixels based on photodiodes transforming a stream of incident photons into photogenerated carriers, and a read-out circuit commonly called ROIC, for "Read Out Integrated Circuit", for collecting the electrical signal from the pixels of the detector.

A first type of detector comprises interconnection holes called "via holes" and photodiodes of cylindrical symmetry around these interconnection holes. This photodiode is commonly called "loop hole". An infrared imager is thus produced by coupling 3D interconnection (ROIC circuit) and cylindrical photodiode.

Figure 2:
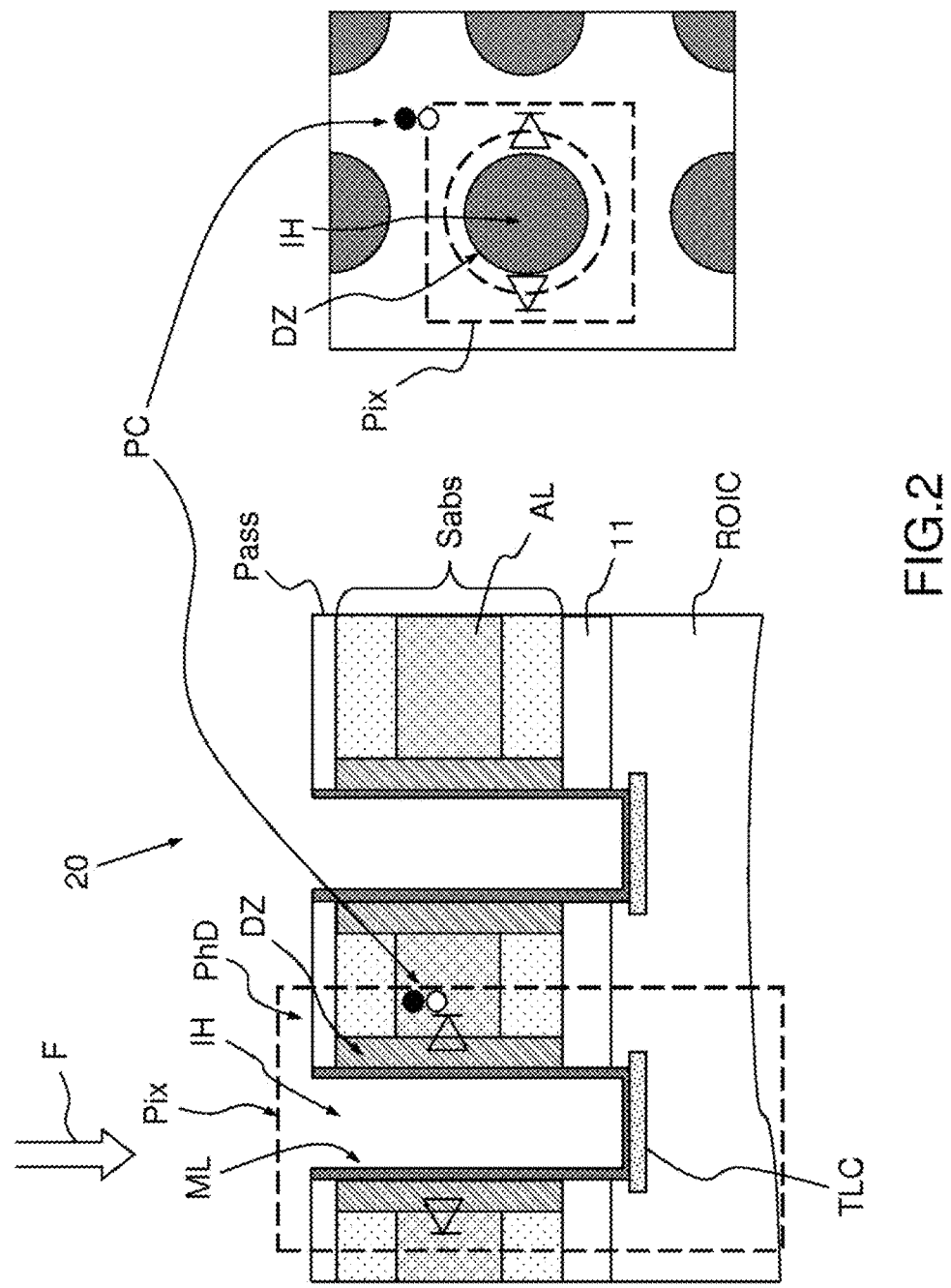
FIG. 2 illustrates a first type of hybrid optical detector having a matrix of photodiodes of "loop hole" type.

A hybrid optical detector 20 having a matrix of photodiodes of "loop hole" type suited to an absorbent structure produced with III-V materials is illustrated in FIG. 2, FIG. 2a corresponding to a cross section and FIG. 2b to a plan view.

The matrix of photodetectors comprises an absorbent structure Sabs comprising at least one absorbent layer AL made of III-V or II-VI material, capable of generating carriers PC from a stream of incident photons F. The structure Sabs is covered with a passivation layer Pass. This structure is assembled with the ROIC circuit by an assembly layer 11, according to the method described above.

The contacts of the read-out circuit ROIC intended to receive the electrical signal generated by each pixel Pix of the detector are buried contacts TLC, called "Top Level Contacts". They are produced at the end of the integrated circuit fabrication method, and are located close to the surface of the circuit.

In a matrix of "loop hole" type, a cylindrical diode PhD is produced around an interconnection hole IH, which passes through the absorbent structure, the assembly layer 11 and the ROIC circuit to the contact TLC. The walls of the hole IH are covered with a metallization layer ML, producing the electrical link between the diode PhD and the contact TLC.

The diode PhD is produced by localized doping of a zone DZ close to the hole IH of a type opposite to the initial doping of the absorbent layer AL. The photodiode of p-n type produces the separation and the transportation of the photogenerated carriers to the metallization layer ML and collects the minority carriers (the holes when the zone DZ is p doped). Each doped zone DZ which extends annularly around an interconnection hole IH makes it possible to define a pixel Pix of the detector, and the metallized holes IH produce an electrical connection between DZ and the contact TLC.

The document WO2013079603 describes a method for fabricating a detector 20 based on "loop hole" diodes as described above, with an absorbent layer AL made of III-V material. An example is an absorbent layer made of n-doped InGaAs disposed between two encapsulation layers of InP. The detector 20 of the document WO2013079603 has a configuration of specific illumination through the substrate, and a dual visible/IR imager.

The principle of the method for producing a detector of "loop hole" type is illustrated in FIG. 3.

Figure 3A:
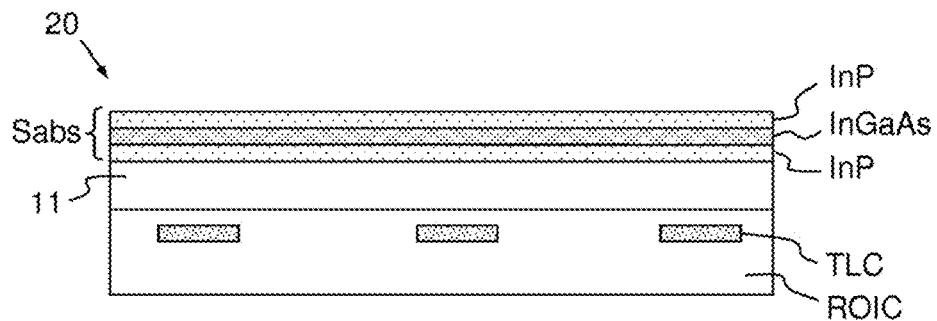
FIGS. 3a to 3e schematically represent the different steps of this method.
Figure 3B:
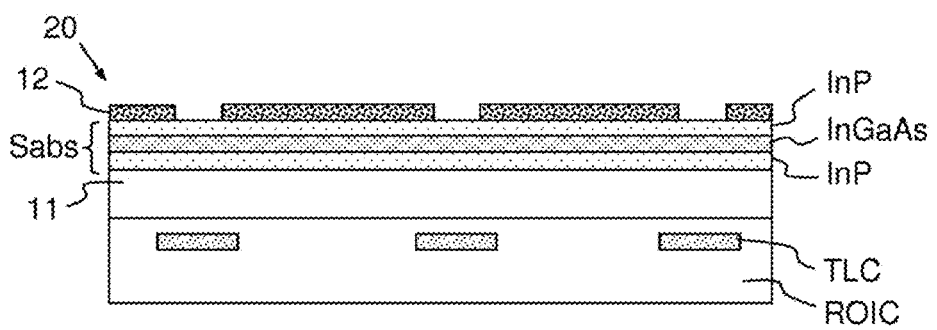

In a first step illustrated in FIG. 3a, a semiconductive structure Sabs comprising the absorbent layer AL between two barrier layers is assembled by bonding, via an assembly layer 11, with a read-out circuit ROIC having buried contacts TLC. Then, a masking dielectric 12 is deposited on the structure Sabs, and a part of the masking dielectric layer facing the contacts TLC is etched as represented in FIG. 3b.

Figure 3C:
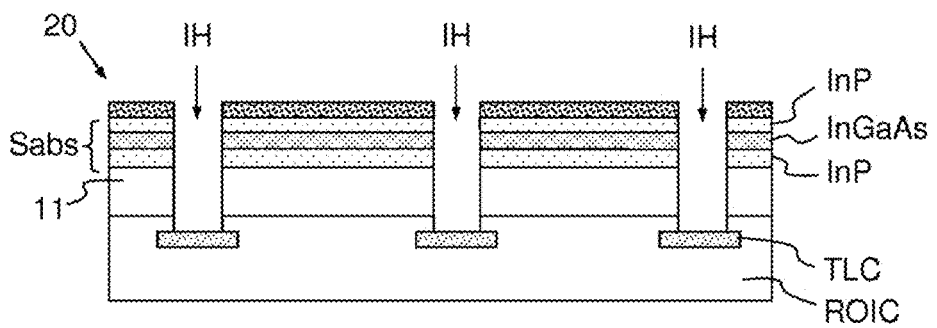

The interconnection holes IH are produced by vertical etching to the contacts TLC, through the absorbent structure and the assembly layer as illustrated in FIG. 3c. The etching is done by dry process or by wet process.

Figure 3D:
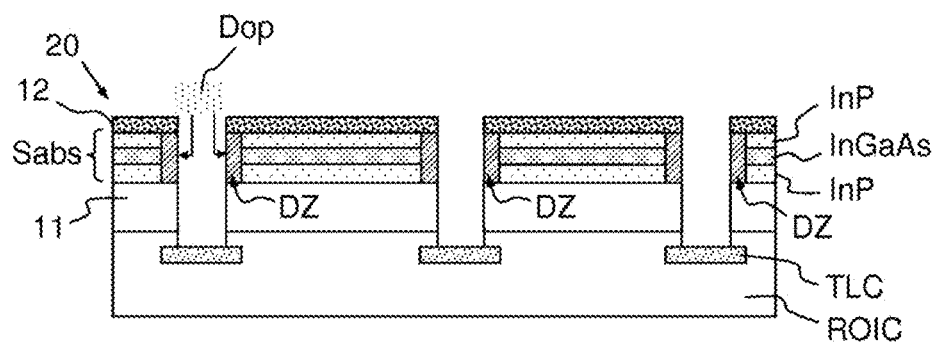

In a step illustrated in FIG. 3d, a doped zone DZ is produced, for example of p type, by diffusion or ion implantation of a dopant Dop via each hole IH, so as to form a photodiode PhD comprising a cylindrical p-n junction. The diffusion is done from the surface of the walls of the hole IH, and, in parallel, through all the layers that make up the absorbent structure.

Figure 3E:
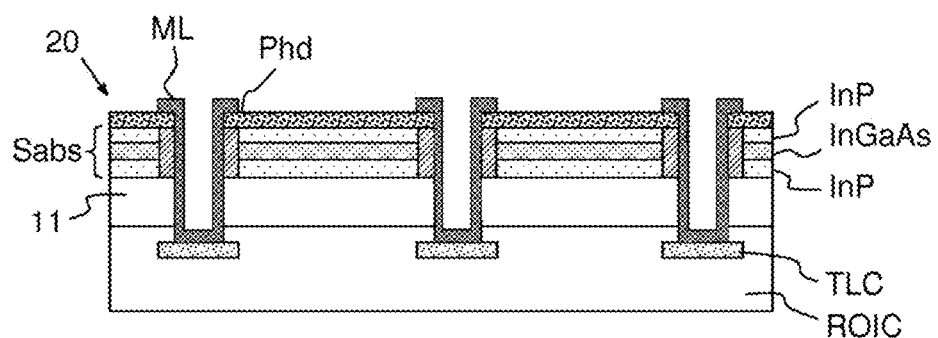

In a final step illustrated in FIG. 3e, a metallic layer ML is deposited on the walls of the holes IH so as to place the doped zone DZ and the contact TLC in electrical contact.

Figure 4:
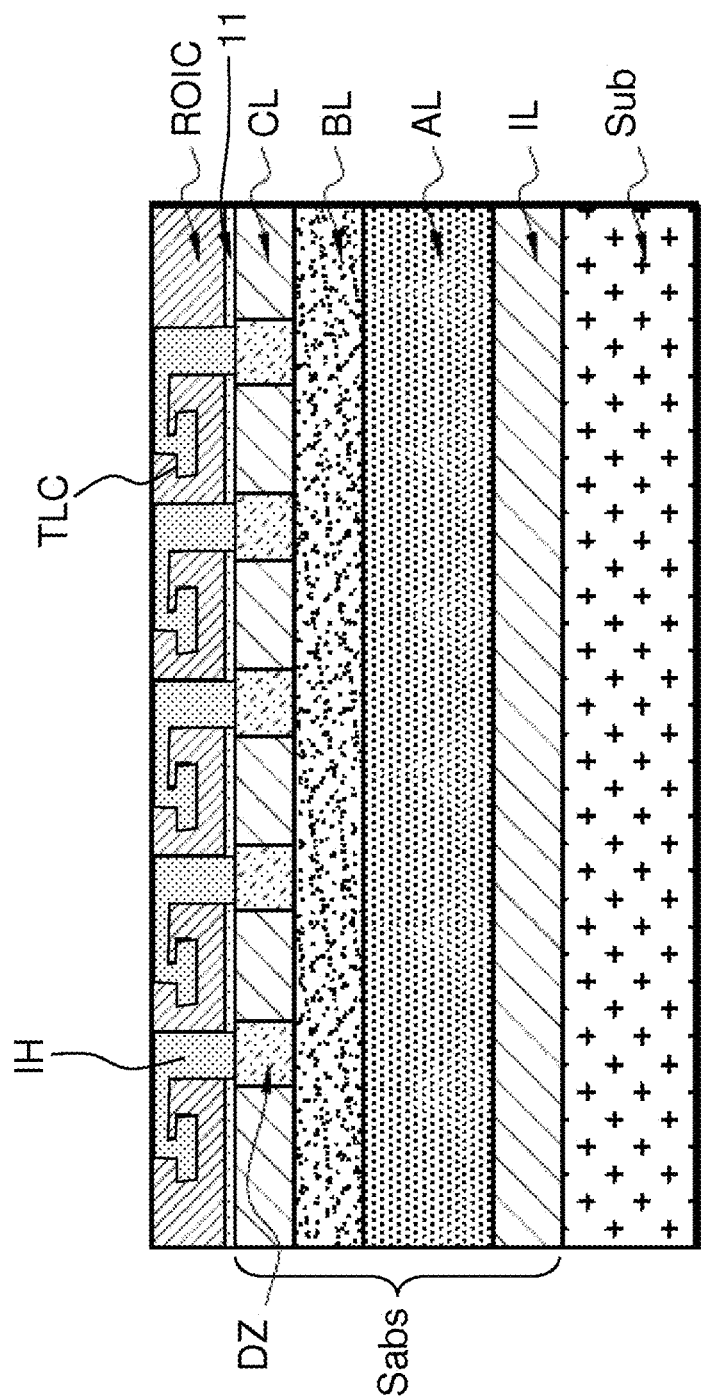
FIG. 4 illustrates a second type of hybrid optical detector, particularly suited for infrared, called TSV.

In a second type of IR detector, illustrated in FIG. 4, the interconnection holes IH are not produced so as to pass through the absorbent structure as in the "loop hole" structure, but pass through the read-out circuit ROIC of CMOS type. This variant will be called TSV, for "Through-Silicon Via". This type of detector is described in the patent application FR1601066 not yet published at the time of drafting of this patent application.

The absorbent structure Sabs, deposited on a substrate Sub, in this case comprises: an absorbent active layer AL, an interface layer IL deposited between the substrate and the active layer, the purpose of which is to ensure a good common electrical contact while limiting the generation of dark current; a barrier layer BL deposited on the absorbent layer and a contact layer CL, deposited on the barrier layer, comprising the doped zones DZ.

The overall thickness of the structure in the stack direction is between 0.5 and 10 µm.

The diode is created by stacking of the vertical layers, notably by using a barrier, without needing doping to fabricate the diode (unlike the loop hole technology) but only to define the contact. Conventionally, the gap of the active layer is most often smaller than the gap of the substrate and smaller than the gap of the interface layer.

For the fabrication of such a detector, after the assembly between the absorbent structure and the read-out circuit ROIC, the interconnection holes IH are etched through the read-out circuit. In this case, the initial substrate of silicon on which the ROIC circuit was produced has been made thinner (thinner substrate not represented).

Then, the doped zones DZ are produced by doping of the contact layer CL through the vias IH, for example by diffusion or implantation. Finally, a step of finalization of the connections consists in producing the contacts for each pixel by filling the holes IH with a metallic material and by connecting this metal with the contacts TLC.

Preferentially, the absorbent layer AL of the absorbent structure (for both the "loop hole" and "TSV" variants) consists of a III-V alloy, but also can be a II-VI material such as HgCdTe.

Examples of material forming the layer AL are: InGaAs/InP, InAsSb, InAsSb/InAs superlattice; InSb, GaSb/InAs superlattice; GaN; AIGaN, AlInN, AlGaAsSb, GaAs/AlGaAs or InGaAs/AlInAs multiple-quantum wells. The material is chosen according to the desired sensitivity wavelength range. The materials of the adjacent layers are matched to the material of the layer AL.

Each layer forming the absorbent structure Sabs is, conventionally, matched meshwise or quasi-matched meshwise with the adjacent layer or layers.

The absorbent structure is produced by epitaxy of the layers on an initial substrate Sub.

Figure 1:
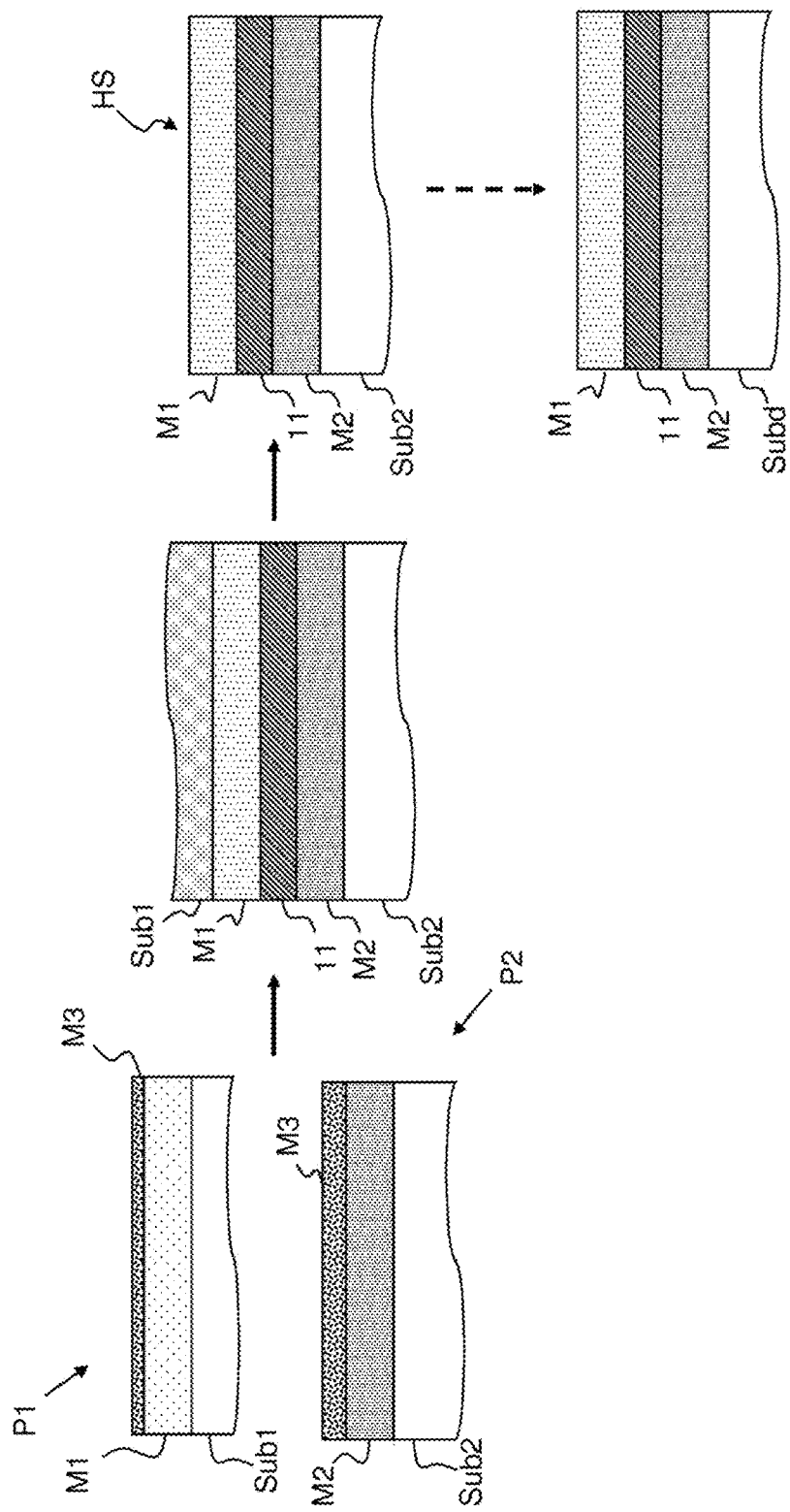

As a variant, the substrate Sub of FIG. 4 is not the initial substrate. That has been removed and replaced by a more rigid substrate exhibiting an enhanced mechanical withstand strength, for example silicon or any other rigid material used in the industrial integrated circuit fabrication technological methods. This replacement step is performed once the absorbent structure is glued to the read-out circuit (see FIG. 1).

Figure 5:
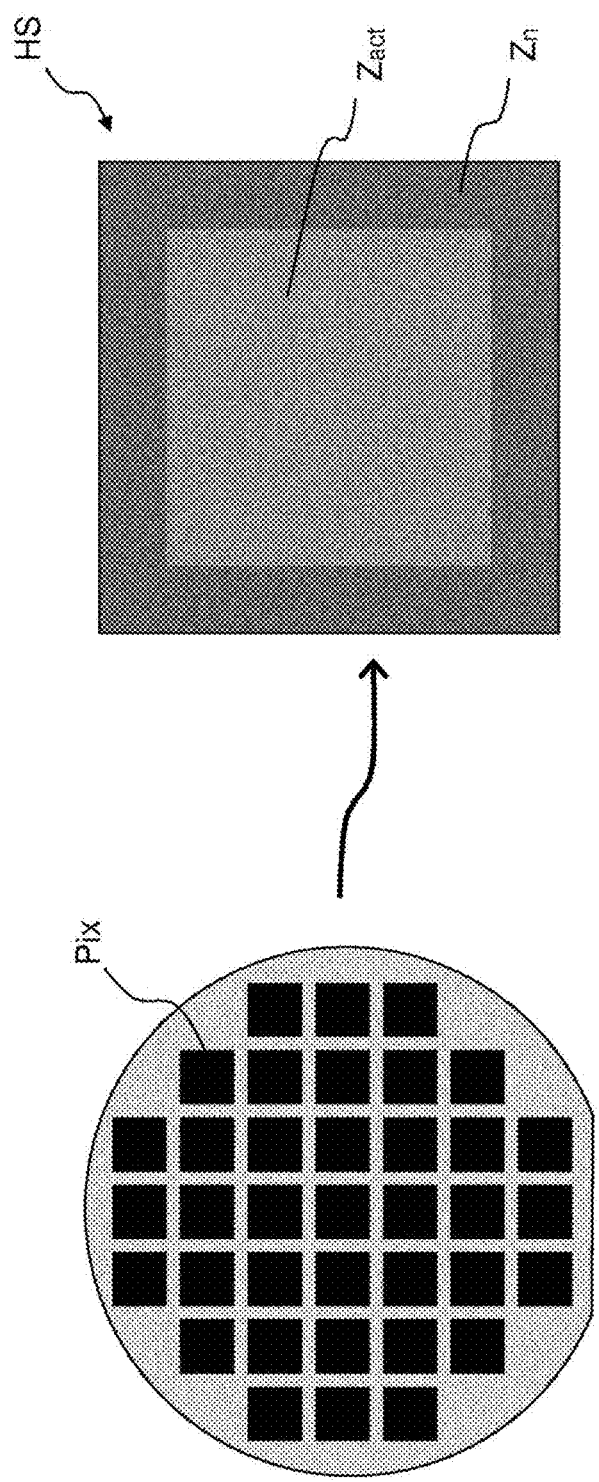
FIG. 5 illustrates a "large surface area" hybrid system, having a set of pixels Pix arranged according to a matrix.

It will also be noted that the "large surface area" hybrid systems, for example detectors or displays, have a set of pixels Pix that are often arranged according to a matrix, as illustrated in FIG. 5. The hybrid system HS then has an active central zone Zact, that is to say one that is functional, and, on the periphery, a non-functional zone Zn.

Producing a matrix of "loop hole" photodiodes for an imager requires the production over a large surface area (>1 mm$^2$) of a large number of homogeneous pixels and their connections to the read-out circuit. These pixels are produced by etching connection vias of diameter d1, then by diffusion at approximately 400° C. of zinc in order to locally dope each via. In addition, other steps of the method (for "loop hole" or TSV) are likely to be performed at temperatures of this order of magnitude: deposition of a dielectric, activation curing, contact curing, etc.

Figure 6:
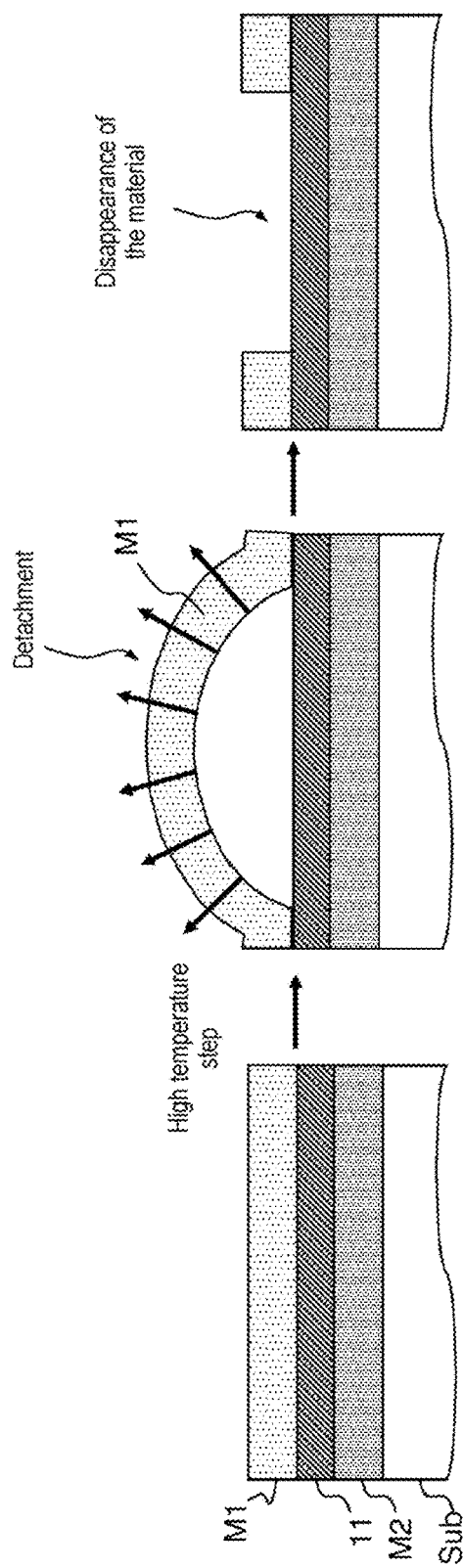
FIG. 6 illustrates the detachment of the transferred layer of III-V material from the read-out circuit deposited on a substrate.

Now, the inventors have noted that, when the temperature of the bonded hybrid structure is raised above 300° C., the added layer of III-V material (material M1) can be detached from the read-out circuit (material M2: silicon) deposited on a substrate Sub (also of silicon if there has been no replacement), as illustrated in FIG. 6. This separation can go as far as the local bursting of M1, leaving zones without material M1. Generally, the term "bubble" is used to qualify the disturbed zones. The presence of these bubbles is of course highly prejudicial to the good operation of the hybrid system and to the rest of the fabrication method.

Figure 7:
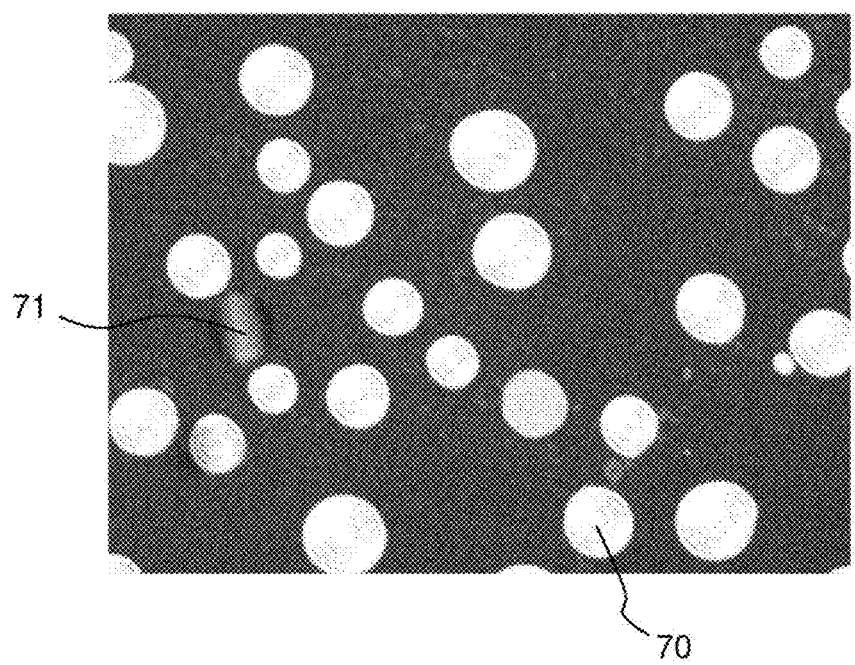
FIG. 7 is a photograph of the bonding zone of a hybrid system of "loop hole" detector type as illustrated by FIG. 2 after the high-temperature zinc diffusion step.

FIG. 7 illustrates a photograph of the bonding zone of a hybrid system of "loop hole" detector type as illustrated in FIG. 2 after the step of diffusion of the zinc at high temperature. The detector consists of:

Sub and ROIC material M2: Si
M3 bonding material: SiO$_2$
Absorbent structure: InP/InGaAs (AL)/InP, i.e. an InP material M1 and an InGaAs material M1', both being III-V materials.
Passivation layer: SiN The white bubbles 70 correspond to zones which have lost the material M1, and the bubble 71 corresponds to a zone with a material M1 which is detached and stressed. These bubbles typically have a diameter of between 10 and 100 µm.

The inventors have also noted that these bubbles appear primarily in the zones without interconnection vias, that is to say pixels, which are therefore non-functional zones, called neutral zones, situated at the periphery of the detector (see FIG. 5). The zones with vias are totally free of them.

These neutral zones are zones without structuring, without pattern, that is to say without spatially delimited layers. That does not mean that these zones are useless for the read-out circuit, only that these surfaces do not have a "top level" pattern for the connection to the absorbent structure or to the final connections of the components. There are structures/electronic components at deeper levels. And it is found that bubbles appear at the levels of all these surfaces, greatly degrading the quality of the photolithography steps, the matrix and, ultimately, its performance levels.

There are several hypotheses that could explain the origin of these bubbles.

A first hypothesis is that this phenomenon is due to a degassing (dihydrogen, water, etc.) of the bonding or circuit silica. In the non-structured zones, the gas builds up to form bubbles, then breaking the bond between the circuit and the III-V stack. By contrast, in the structured zones, the vias would serve as chimneys for discharging this gas, greatly limiting the formation of bubbles.

A second hypothesis for this phenomenon would be that, because of the great difference in thermal expansion between the silicon and the III-V materials ($2.6.10^{-6\circ}$ C.$^{-1}$ for silicon and $4.6.10^{-6\circ}$ C.$^{-1}$ for InP), the strong temperature rises would increase the stresses on the bonding interface and would thus break the links, forming the bubbles. The zones with vias would make it possible to reduce these stresses by providing available volume and thus prevent the formation of vias.

Obviously, these two hypotheses can each contribute to the phenomenon.

Based on these studies and hypotheses, a hybrid system is proposed according to the invention which has "holes" in the zones which normally have none. This concept is applicable to any "large surface area" hybrid system, including those for which the functional zone has no via. In all the cases, the presence of holes makes it possible to reduce the appearance of these bubbles.

Figure 8:
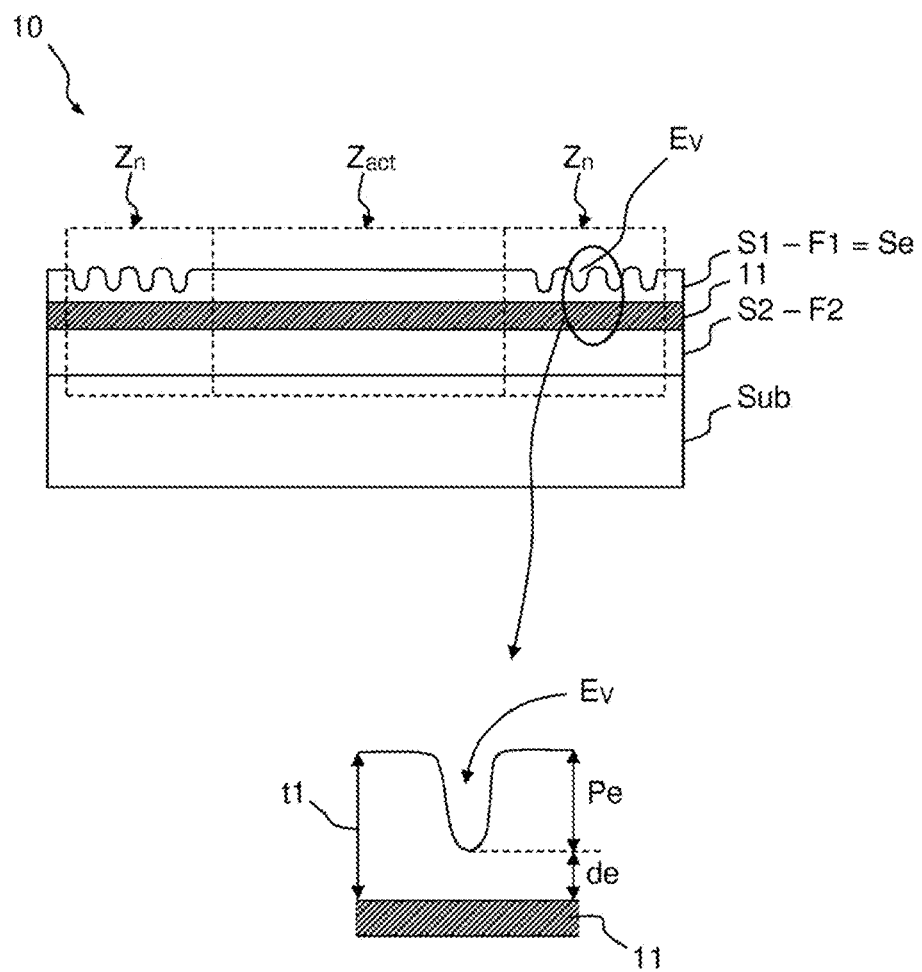
FIG. 8 illustrates a hybrid system according to the invention in cross section
Figure 9:
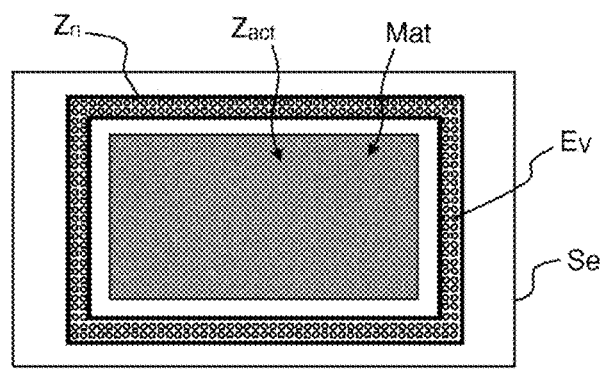
FIG. 9 illustrates a hybrid system according to the invention in plan view from the side having the holes.

A hybrid system 10 according to the invention is illustrated in cross section in FIG. 8, and in plan view in FIG. 9, from the side having holes of depth Pe.

The hybrid system 10 according to the invention is optical and/or electronic as explained above.

It comprises: a first planar structure S1 having a first functionality produced in at least one first material M1 and a second planar structure S2 having a second functionality produced in at least one second material M2 that is different from the first material. For example, for a functionality of detector type, the corresponding structure can consist of a plurality of layers of different materials but materials that are matched meshwise, such as InP/InGaAs/InP. There is therefore a material M1 in InP and a material M'1 in InGaAs. For a functionality of circuit type, the most common variant is a circuit produced in silicon.

The first planar structure and the second planar structure are assembled by an assembly layer 11, at least one of the planar structures being disposed on a rigid substrate Sub. When the system comprises a circuit functionality (generation/collection/processing of an electrical signal), the substrate Sub is then also of silicon (if it has not been replaced).

Furthermore, as seen above, the hybrid system 10 comprises at least one active zone Zact used to implement the functionalities, and at least one neutral zone Zn not used to implement these functionalities and disposed at the periphery of said active zone.

The hybrid system is preferentially a "large surface area" hybrid system, that is to say with a surface area of the central useful zone of at least 1 mm$^2$.

Finally, the system also comprises recesses Ev produced in at least one neutral zone Zn of the planar structure which is not disposed on the rigid substrate, called recessed planar structure Se.

The recesses are disposed in non-functional zones and at the periphery, and therefore do not disturb the operation of the system. These are simple "holes" which have no electrical functionality. Their function is to allow the degassing and/or the relaxation of the thermal stresses in order to reduce, even eliminate, the bubbles described previously.

Figure 10:
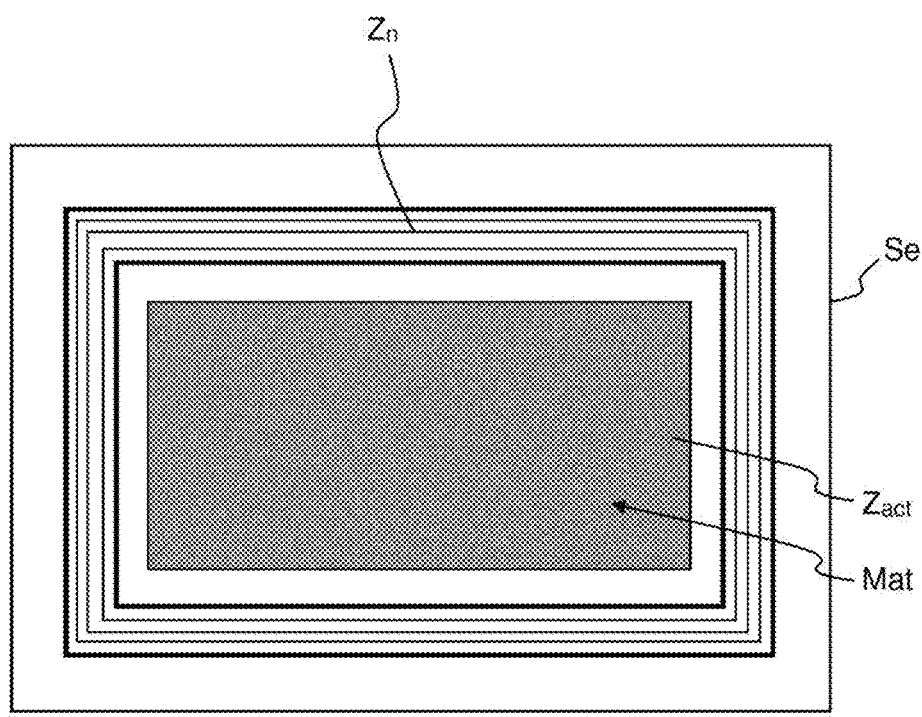
FIG. 10 illustrates a hybrid system according to the invention having recesses in furrow form.

The term "recess" is used because they can take any appropriate form. For example, they can take the form of holes as illustrated in FIG. 9, according to miscellaneous variants such as cylindrical, of circular, square, triangular, pentagonal base, etc. or conical, or furrows as illustrated in FIG. 10. The important thing is to produce cavities in one of the structures that allow for the discharging of the dihydrogen and/or the relaxing of the mechanical stresses due to the expansion differential between M1 and M2.

To facilitate the fabrication thereof, the recesses are preferentially produced in the structure Se that is the least thick, that is to say that which is not disposed on the rigid substrate Sub which supports the system. Preferentially, the recessed planar structure Se has a thickness less than 20 μm.

The depth Pe of the recesses is a function of the thickness of the structure Se, and this thickness can vary between 1 μm and 20 μm. Preferentially, the depth Pe of the recesses Ev is such that a bottom of said recess is disposed at a distance "de" from the assembly layer that is less than 1 μm. The inventors have shown that it is not necessary, to obtain the elimination of the bubbles, for the recess to reach the assembly layer 11, it is sufficient to approach it closely enough to obtain the desired effect. That makes it possible to produce recesses that are less deep which do not risk damaging the underlying structure, such as a component of the circuit.

When recesses are produced in detectors using interconnection vias IH, they can be produced in the step of etching of these vias. They will then undergo all the other steps of the method, and therefore, in this variant, the recesses are metallized, that is to say covered with a metallic layer, like the IHs.

According to one embodiment, to obtain a good relaxing of the thermal stresses, the material of the recessed planar structure Se has a thermal expansion coefficient greater than the thermal expansion coefficient of the other planar structure. For an InP/GaInAs/InP on silicon ROIC "loop hole" detector, with holes Ev on the side of the vias IH of the detector, this condition is realized ($2.6.10^{-6\circ}$ C.$^{-1}$ for silicon and $4.6.10^{-6\circ}$ C.$^{-1}$ for the InP).

Preferentially, the assembly is done by molecular bonding. The assembly layer then preferentially comprises silica.

Figure 11:
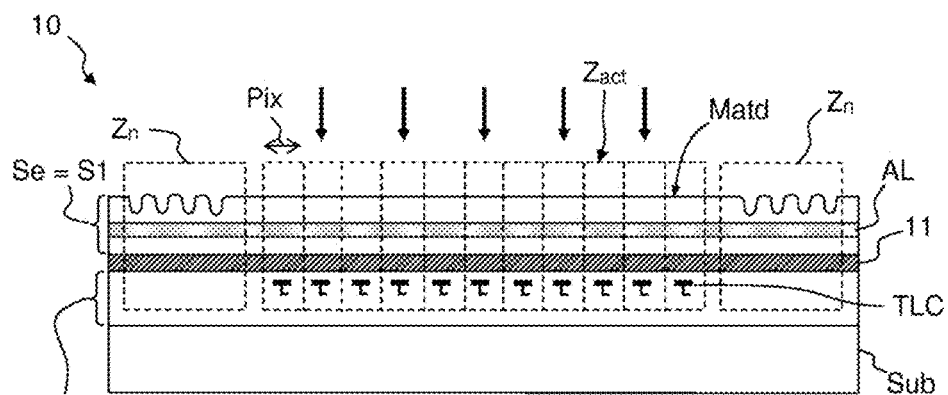
FIG. 11 illustrates a first variant of an optoelectronic detection system according to the invention comprising a matrix of pixels.

FIG. 11 illustrates a first variant of an optoelectronic detection system 10 according to the invention comprising a matrix of pixels Matd.

The first functionality is a pixelized photogeneration of carriers, the first structure S1 comprising a plurality of layers including an absorbent layer AL made of II-VI or III-V semiconductor material, and in which the second functionality is a read-out of a signal generated by a pixel, the second structure S2 comprising a read-out circuit ROIC which comprises buried contacts TLC.

An active zone Zact comprises the matrix of pixels Matd and a neutral zone Zn is disposed at the periphery of the matrix of pixels.

The recesses are produced in the first structure, and the substrate Sub is the substrate of the ROIC circuit, typically of silicon.

Figure 12:
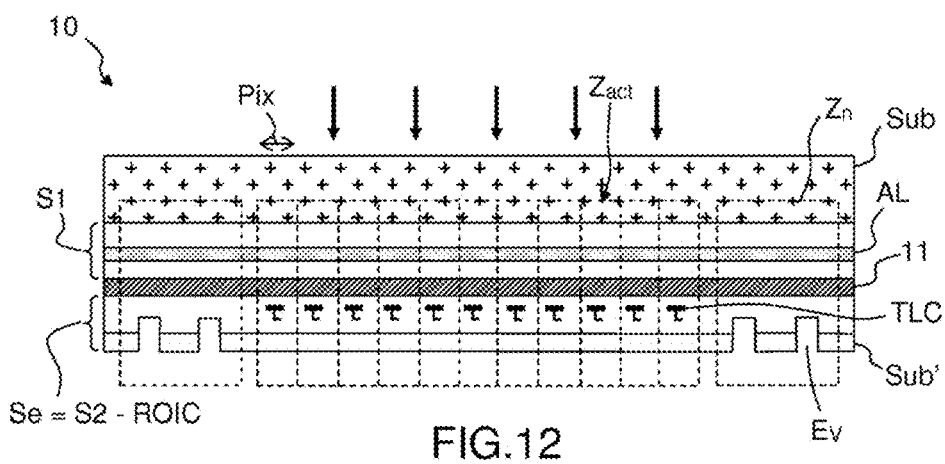
FIG. 12 illustrates a second variant of an optoelectronic detection system according to the invention comprising a matrix of pixels.

FIG. 12 illustrates a second variant of an optoelectronic detection system 10 according to the invention comprising a matrix of pixels Matd.

Here, the rigid substrate Sub is the substrate of the detection layers either the initial substrate of InP or a replacement substrate, such as silicon. The recesses are produced in the second structure ROIC, and the recesses pass through the substrate of thinner silicon Sub' of the circuit ROIC and at least a part of the circuit itself.

According to one embodiment, applicable to the above two variants, the first structure S1 of the hybrid optoelectronic detection system comprises, in at least one layer, a plurality of doped zones DZ configured to collect carriers photogenerated by the absorbent layer, a doped zone making it possible to define a pixel Pix of the detection system.

The electrical signal is then generated by a pixel from the carriers photogenerated by the absorbent layer AL, and the electrical connection between a doped zone DZ and a buried contact TLC of the read-out circuit ROIC is produced via metallized interconnection holes IH.

The recessed planar structure Se is then preferentially that which is passed through by the interconnection holes IH.

Figure 13:
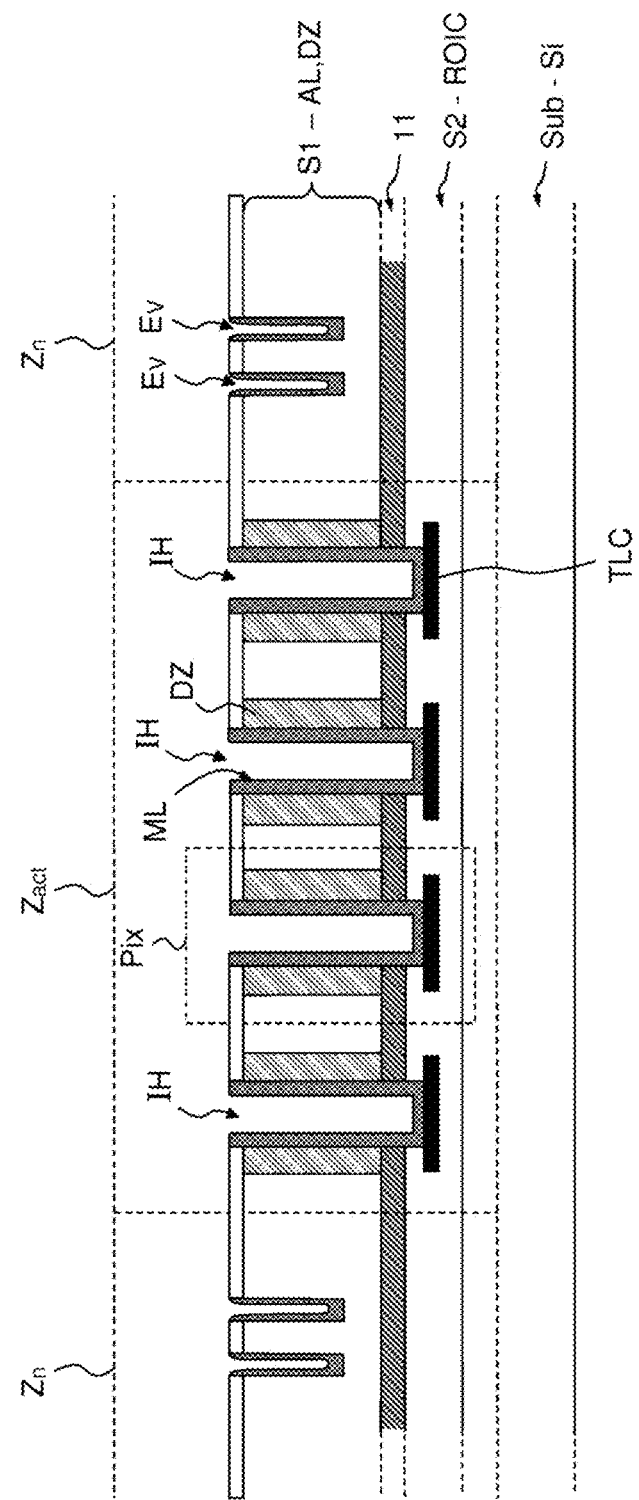
FIG. 13 illustrates a hybrid detection system according to the invention of "loop hole" type.

A hybrid detection system 10 of "loop hole" type according to the first variant and according to the above embodiment is illustrated in FIG. 13.

The second structure S2 is disposed on the rigid substrate Sub, the interconnection holes IH pass through the first structure S1, the assembly layer and the read-out circuit ROIC to the contact TLC. Each doped zone DZ extends annularly around an interconnection hole IH, and the recessed planar structure Se is the first planar structure S1.

Figure 14:
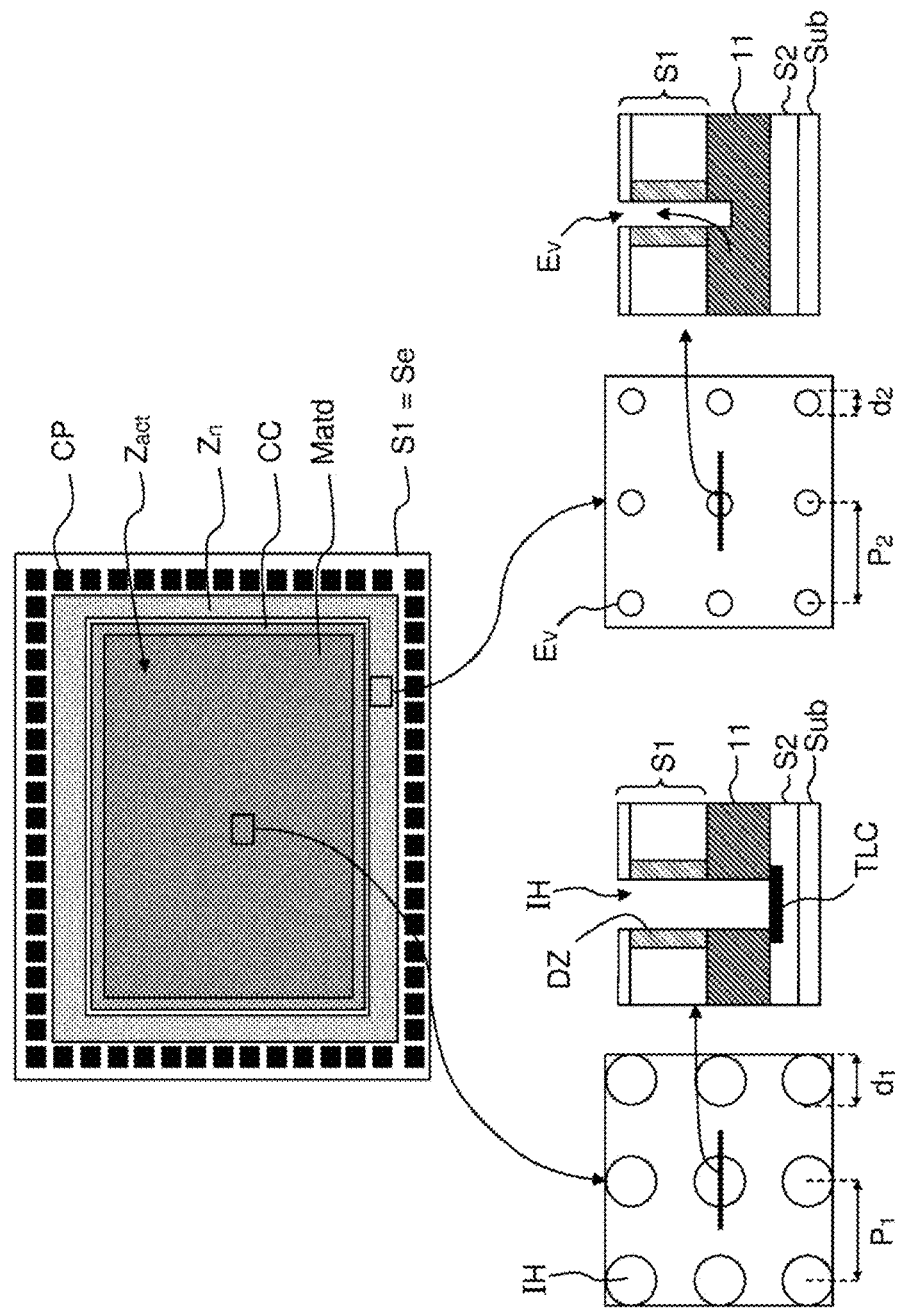
FIG. 14 illustrates an embodiment of the detection system of "loop hole" type according to the invention.

According to an embodiment illustrated in FIG. 14, the active zone of the detection system 10 according to the invention of matrix "loop hole" type comprises the matrix Matd of pixels Pix and also comprises a common contact CC around the matrix. At the system periphery, there are connection pads CP for controlling the read-out circuit and extracting the video signal of the imager. The system thus has a non-functional neutral zone Zn between the common contact CC and the connection pads CP in which the recesses Ev are produced.

Preferentially, the depth pe of a recess Ev is such that the latter does not reach the read-out circuit ROIC, so as not to risk damaging the latter.

According to one embodiment, the vias IH are circular holes which have a diameter d1 and a depth p1 and the recesses Ev are also circular holes which therefore have a depth p2<p1 and a diameter d2<d1. In fact, during etching, it is known that the depth of the vias decreases with their diameter, and therefore, if a depth d2<d1 is desired, d2 must be less than d1.

Thus, the creation, in the zones without system pixel or contact pad, of holes of a diameter d2 less than the diameter d1 of the interconnection vias prevents the formation of bubble detaching III-V material during the fabrication steps performed at temperatures higher than 300° C.

These holes Ev are preferentially produced at the same time as the vias IH for loop hole. Their production does not require specific lithography or even etching step. The diameter d1 of the vias IH is chosen in such a way that the depth p1 is such that IH emerges on the "top metal" level (case of the pixels), and the diameter d2 of the holes Ev is chosen in such a way that the depth p2 is such that Ev emerges at the level of the bonding silica (in the zones without pixels). The non-pixelized zones are not covered with "top metal" level.

The holes Ev, produced at the same time as the vias IH, also have a doped zone DZ and a metallization (not represented in FIG. 14).

A second advantage of this embodiment is that the surfaces which were free (without vias), will then undergo the same fabrication mechanisms, and homogenize the surface of the matrix during the fabrication steps requiring the intervention of reactive species (plasma etching, dopant diffusion). A better homogeneity of pixels of the matrix is then obtained by reducing the differences between edge and center of the matrix.

Figure 15:
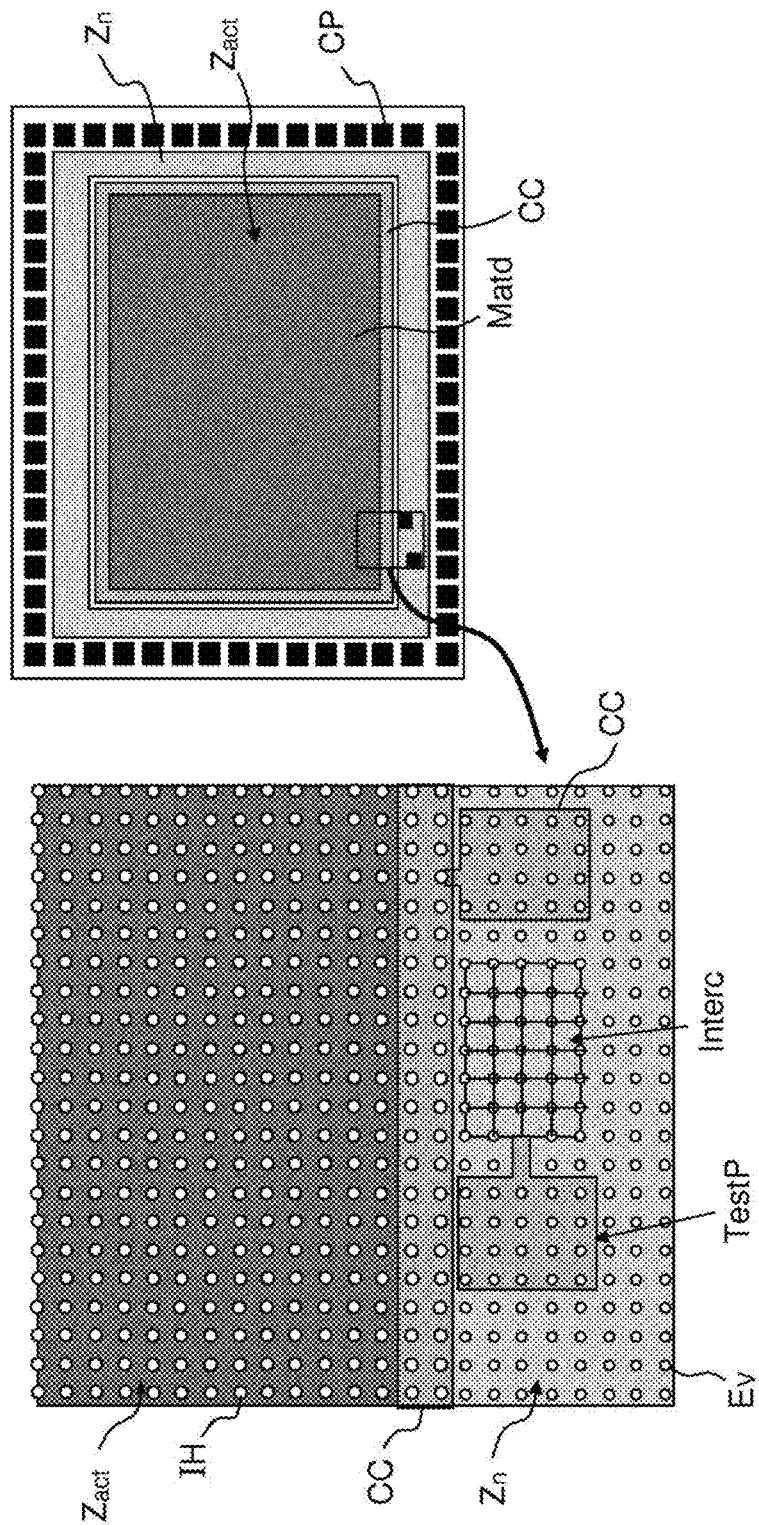
FIG. 15 illustrates a particular embodiment of the detection system of "loop hole" type according to the invention.

In a particular mode of this embodiment illustrated in FIG. 15, use is made of the fact that holes Ev have the same characteristics as vias IH. Recesses forming a first plurality are interconnected with one another so as to form a test pad TestP and recesses forming a second plurality are linked to one another and to the common contact CC of the matrix of pixels Matd. A surface test pattern is thus produced that makes it possible to check the correct progress of the via etchings, of the localized doping by diffusion and of the metallizations.

Figure 16:
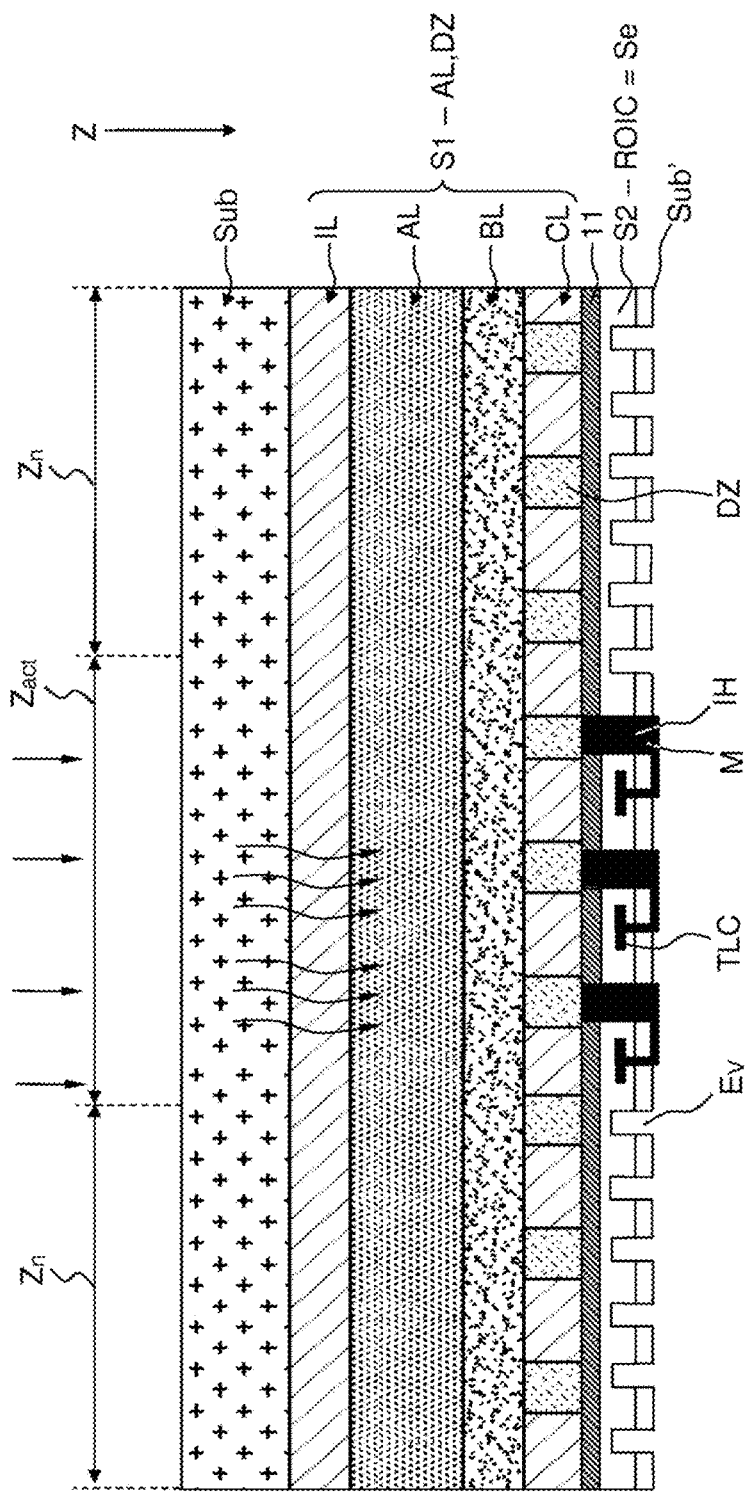
FIG. 16 illustrates a hybrid detection system of TSV type according to the second variant of the invention.

A hybrid detection system 10 of TSV type according to the second variant (see FIG. 12) is illustrated in FIG. 16. The interconnection holes IH pass through the thinner substrate sub' and the second planar structure S2. The recesses Ev are produced on the side of the read-out circuit, through the thinner substrate of silicon sub'. The recessed planar structure Se is, here, the second planar structure S2. The rigid substrate Sub here disposed on the side of the incident light rays must then be transparent in the spectral band of interest.

Figure 17:
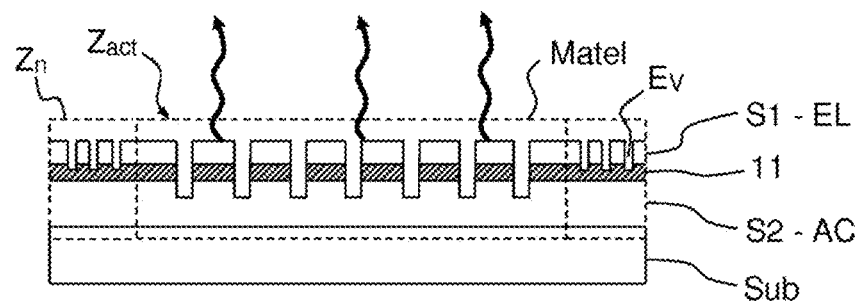
FIG. 17 illustrates a hybrid optoelectronic display system comprising a matrix of light-emitting pixels according to the invention.

According to a variant, the hybrid system 10 is an optoelectronic display system comprising a matrix of light-emitting pixels Matel, as illustrated in FIG. 17, for example of the LED microdisplay type. The first functionality is a pixelized emission, the first planar structure S1 comprises a plurality of layers including a light-emitting layer EL. The second functionality is a generation of electrical signals suitable for producing the light emission, the second planar structure S2 comprising an addressing circuit AC for the pixels deposited on a substrate Sub, preferentially of silicon.

The at least one active zone Zact comprises the matrix of pixels Mael and the at least one neutral zone Zn is disposed at the periphery of said matrix of pixels. Preferentially, the recessed structure Se corresponds to S1.

Figure 18:
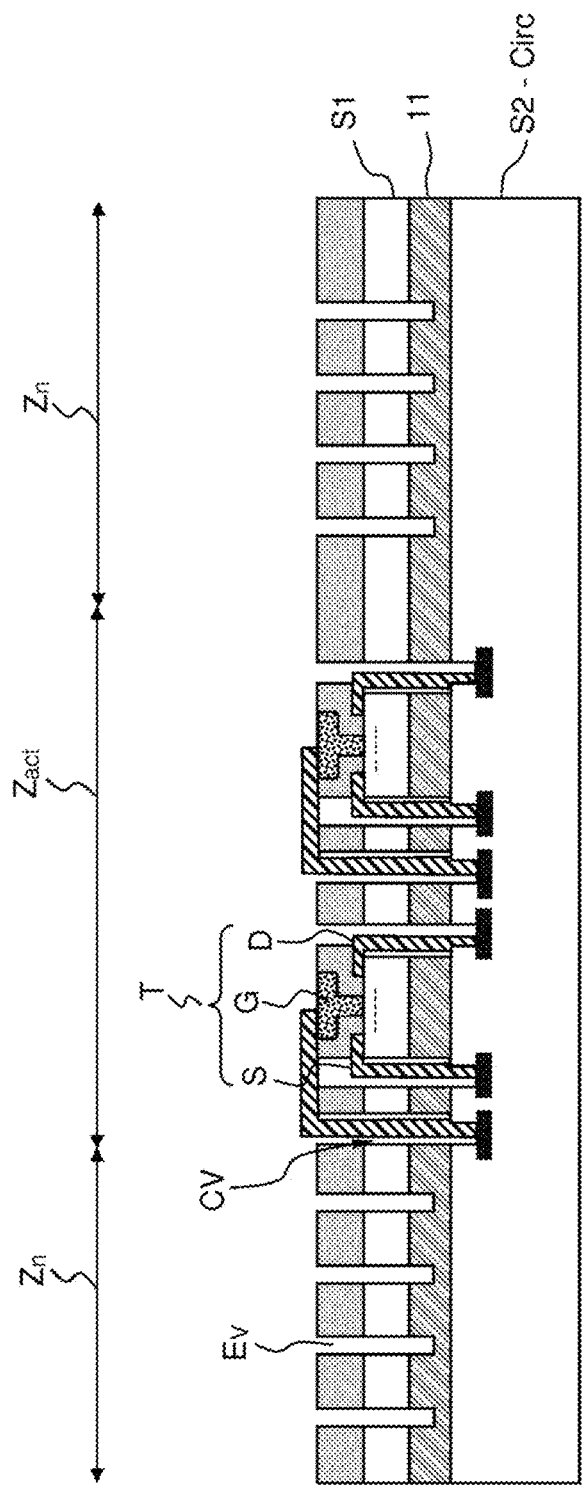
FIG. 18 illustrates a hybrid electronic system of power and/or fast transistors according to the invention.

According to another variant, the hybrid system 10 is a fast electronic system illustrated in FIG. 18, derived from the heterogeneous integration of III-V materials on a CMOS on silicon circuit. The first planar structure S1 comprises a plurality of transistors T and the second planar structure S2 comprises circuits Circ associated with said transistors. The active zone Zact comprises the transistors T and the neutral zone Zn in which the recesses are produced is disposed at the periphery of the transistors, the recessed structure Se corresponding to the first planar structure S1.

The first material for the transistors is, for example, GaN, InP or GaAs and the second material for the circuits is, for example, silicon.

Bipolar heterostructure transistors in InGaAs/InP make it possible to perform fast analog conversion functions up to a few tens of GHz. An InP bond on a CMOS circuit makes it possible to associate fast functions on InP and digital functions on CMOS.

According to one embodiment of the display systems of FIG. 17 or of the electronic systems of FIG. 18, the active zone Zact comprises interconnection holes or connection vias CV that take various forms, to discharge the bubbles which could be formed in this zone. Here, also, the simultaneous production of degassing vias, that is to say recesses Ev, and of electrical connection vias CV (base, collector, emitter in the bipolar transistor case, gate, drain, source in the case of a field effect transistor) makes it possible to discharge bubbles likely to form during the integration (assembly) on a surface area of a few square millimeters.

Examples cited include power components on GaAs or GaN associated with an MMIC circuit with interconnection vias between microstrip microwave line and interconnection of the transistors.

Figure 19:
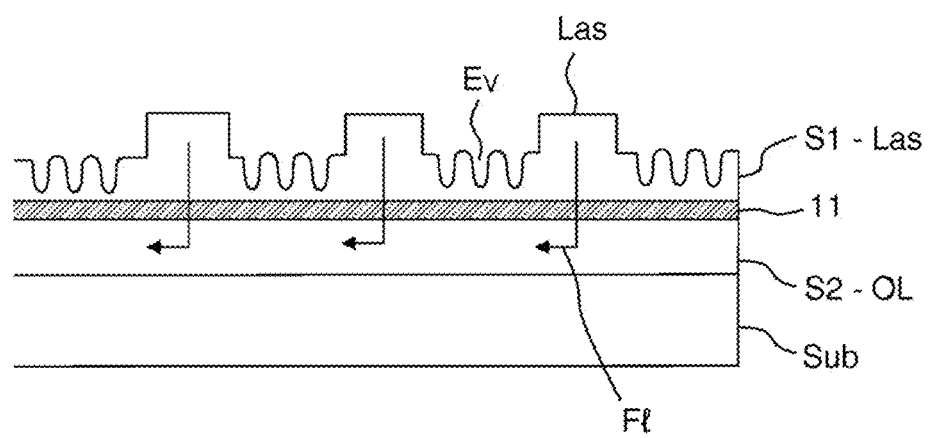
FIG. 19 illustrates an optical or optoelectronic system comprising laser emitters.

An optical or optoelectronic system is illustrated in FIG. 19. The first functionality is an individualized laser emission, the first planar structure S1 comprising a plurality of laser emitters Las, the second functionality is a processing of the optical beams Fl generated by the laser emitters Las. The second planar structure S2 comprises at least one optical processing layer OL deposited on the rigid substrate Sub. The laser emitters are configured to emit to the layer OL. The processing layer or layers perform guiding, multiplexing/demultiplexing, filtering, amplification and other such functions.

The recesses are produced in the zones that have not been eliminated in the fabrication of the laser strips. These are non-functional zones, but zones which have been able to be kept in order to protect the underlying circuit. The recesses are produced in the zones which have no laser strip but where there is still transferred material.

Figure 20:
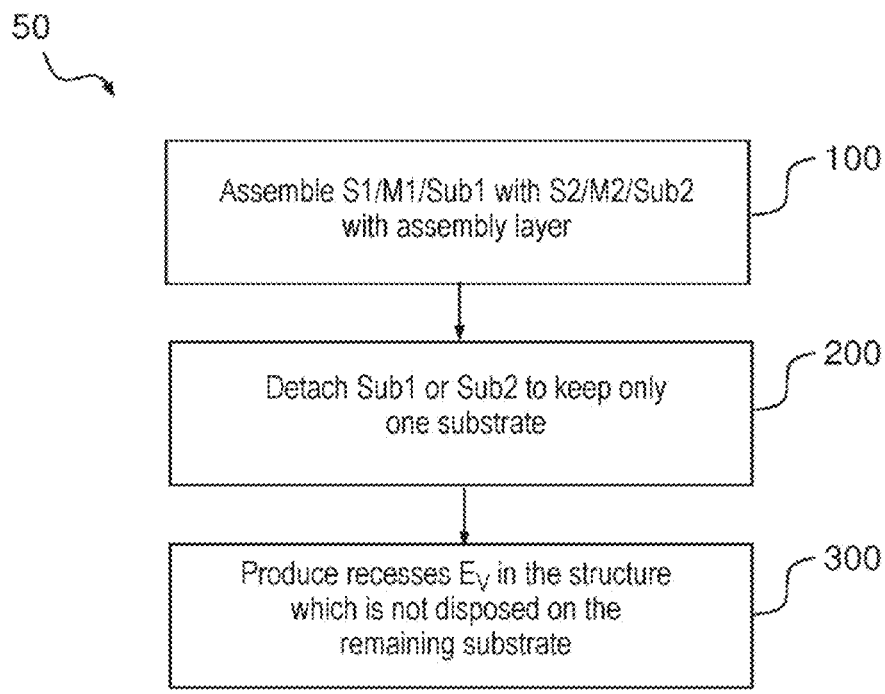
FIG. 20 illustrates a method for fabricating a hybrid optical and/or hybrid electronic system according to the invention.

According to another aspect, the invention relates to a method 50 for fabricating a hybrid optical and/or hybrid electronic system, illustrated in FIG. 20. The method comprises a first step 100 consisting in assembling, by an assembly layer 11, on the one hand a first planar structure S1 having a first functionality produced in at least one first material M1, S1 being deposited on a first substrate Sub1, and on the other hand a second planar structure S2 having a second functionality produced in at least one second material M2 that is different from the first material, S2 being deposited on a second substrate Sub2.

The first and second assembled structures comprise at least one active zone (Zact) used to implement said functionalities, and at least one neutral zone (Zn) not used to implement said functionalities.

In a second step 200, at least one of the substrates is detached to retain only a single rigid substrate Sub1 or Sub2. In a variant, the method 50 also comprises a step 250 of replacement of the remaining substrate Sub1 or Sub2 with a destination substrate Subd (see FIG. 1).

These two steps have been described above (see FIG. 1).

In a third step 300, recesses Ev are produced in at least one neutral zone Zn of the planar structure which is not disposed on the rigid substrate Sub called recessed planar structure Se.

Figure 21:
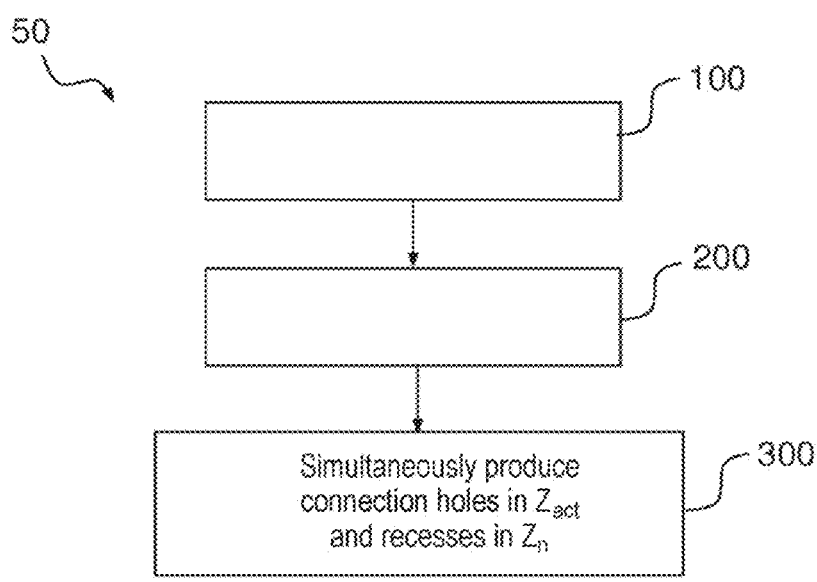
FIG. 21 illustrates a variant of the method illustrated in FIG. 20

In a variant of the method 50 according to the invention illustrated in FIG. 21, the step 300 of production of the recesses consists in simultaneously producing interconnection holes IH or CV in the at least one active zone Zact through one of the planar structures, and recesses Ev in the at least one neutral zone Zn of said planar structure passed through by the interconnection holes. The recessed structure is that through which the connection holes are produced.

Preferentially, the step of simultaneous production of the interconnection holes IH, CV and/or of the recesses Ev is performed by lithography then etching. The lithography technology is chosen from among: electron beam; nanoprinting; optical lithography. The etching technology is chosen from among ion etching, chemical etching, plasma etching.

Figure 22:
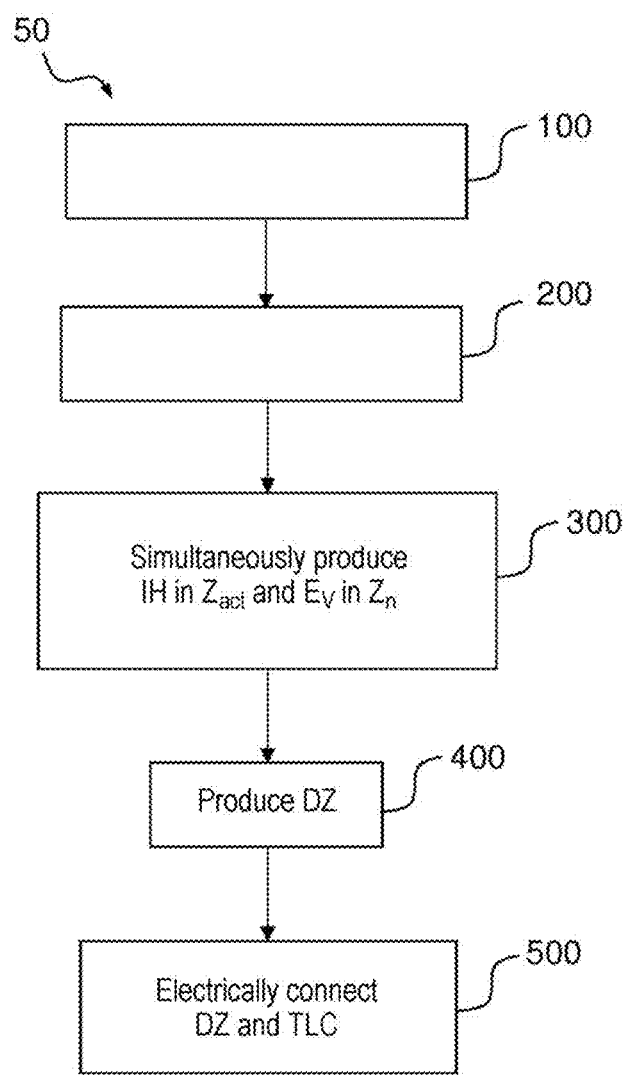
FIG. 22 illustrates a variant of the method illustrated in FIG. 21 applied to the detection systems.

In a variant illustrated in FIG. 22, the method 50 produces a hybrid optoelectronic detector comprising a matrix of pixels Matd.

Here, the first functionality is a pixelized photogeneration of carriers, the first structure S1 comprising a plurality of layers including an absorbent layer AL made of II-VI or III-V semiconductor material.

The second functionality being a read-out of a signal generated by a pixel, the second structure S2 comprising a read-out circuit ROIC intended to recover an electrical signal from said carriers photogenerated by the absorbent layer AL and comprising a plurality of buried contacts TLC.

The at least one active zone Zact comprises the matrix of pixels, and the at least one neutral zone Zn is disposed at the periphery of said matrix of pixels.

In this variant, the step 300 of production of the recesses consists in simultaneously producing interconnection holes IH in the at least one active zone Zact through one of the planar structures, and the recesses Ev in the at least one neutral zone Zn of said planar structure passed through by the interconnection holes.

According to a variant also illustrated in FIG. 22, the method 50 for fabricating a hybrid optoelectronic detector also comprises the following steps, performed after the step 300:

In a step 400, a plurality of doped zones DZ are produced, configured to collect carriers photogenerated by the absorbent layer, a doped zone making it possible to define a pixel Pix of the detector. In a step 500, each doped zone DZ is connected electrically with the associated contact TLC of the read-out circuit ROIC via the interconnection holes IH.

According to one embodiment of this variant, the method 50 according to the invention produces a "loop hole" detector. The step 300 of simultaneous production of the interconnection holes and of the recesses is performed by etching of the first planar structure S1 and, for the interconnection holes, of the read-out circuit ROIC to the buried contacts TLC. The recessed planar structure here corresponds to the first planar structure.

According to another embodiment of this variant, the method 50 according to the invention produces a TSV detector. The step 300 of simultaneous production of the interconnection holes and of the recesses is performed by etching of the thinner substrate sub' on which the read-out circuit ROIC is deposited and by etching, at least partially, of the read-out circuit ROIC. The recessed planar structure Se here corresponds to the second structure S2.

The invention claimed is:

1. A hybrid optical and/or electronic system comprising:
a first planar structure (S1) having a first functionality produced in at least one first material (M1) and a second planar structure (S2) having a second functionality produced in at least one second material (M2) that is different from the first material,
the first planar structure and the second planar structure being assembled by an assembly layer, at least one of the planar structures being disposed on a rigid substrate (Sub), the system comprising at least one active zone (Zact) used to implement said functionalities, and at least one neutral zone (Zn) not used to implement said functionalities and disposed at the periphery of said active zone,
the system further comprising recesses (Ev) produced in at least one neutral zone of the planar structure which is not disposed on the rigid substrate, called recessed planar structure (Se).

2. The system as claimed in claim 1, wherein a depth of a recess (pe) is such that a bottom of said recess is disposed at a distance (de) from the assembly layer that is less than 1 μm.

3. The system as claimed in claim 1, wherein the recesses take the form of holes or of furrows.

4. The system as claimed in claim 1, wherein the recesses are covered with a metallic layer.

5. The system as claimed in claim 1, wherein the material of the recessed planar structure (Se) has a thermal expansion coefficient greater than the thermal expansion coefficient of the other planar structure.

6. The system as claimed in claim 1, wherein the recessed planar structure has a thickness less than 20 μm.

7. The system as claimed in claim 1, wherein the assembly is produced by molecular bonding.

8. The system as claimed in claim 1, wherein a surface area of the at least one active zone is greater than or equal to 1 mm$^2$.

9. An optoelectronic detection system as claimed in claim 1, comprising a matrix of pixels (Matd),
wherein the first functionality is a pixelized photogeneration of carriers, the first structure (S1) comprising a plurality of layers including an absorbent layer (AL) made of II-VI or III-V semiconductor material,
wherein the second functionality is a read-out of an electrical signal generated by a pixel, the second structure (S2) comprising a read-out circuit (ROIC) comprising a plurality of buried contacts (TLC),
and wherein the at least one active zone (Zact) comprises said matrix of pixels and the at least one neutral zone (Zn) is disposed at the periphery of said matrix of pixels.

10. The optoelectronic detection system as claimed in claim 9, wherein the first structure (S1) comprises, in at least one layer, a plurality of doped zones (DZ) configured to collect carriers photogenerated by the absorbent layer, a doped zone making it possible to define a pixel (Pix) of the detection system, wherein the electrical signal is generated by a pixel from said carriers photogenerated by the absorbent layer (AL), an electrical connection between a doped zone (DZ) and a buried contact (TLC) of the read-out circuit (ROIC) being produced by metallized interconnection holes (IH), and wherein the recessed planar structure (Se) is that which is passed through by the interconnection holes.

11. The optoelectronic detection system as claimed in claim 10, wherein the second structure (S2) is disposed on the rigid substrate (Sub), wherein the interconnection holes (IH) pass through the first structure (S1) and the read-out circuit (ROIC) to the contact (TLC), wherein each doped zone (DZ) extends annularly round an interconnection hole, the recessed planar structure (Se) being the first planar structure (S1).

12. The optoelectronic detection system as claimed in claim 10, wherein a depth of a recess (Pe) is such that said recess does not reach the read-out circuit.

13. The optoelectronic detection system as claimed in claim 9, wherein the recesses are produced in the neutral zone (Zn) disposed between a common contact (CC) and contact pads (CP) of said system.

14. The optoelectronic detection system as claimed in claim 13, wherein a first plurality of recesses are interconnected with one another so as to form a test pad (TestP) and wherein a second plurality of recesses are linked to one another and to said common contact (CC) of the matrix of pixels (Matd).

15. The optoelectronic detection system as claimed in claim 9, wherein the first planar structure (S1) is disposed on the rigid substrate (Sub), said rigid substrate being transparent, wherein each doped zone (DZ) is produced in a contact layer (CL) disposed under the absorbent layer (AL),
wherein the second planar structure (S2) is disposed on a thinner substrate (Sub'),
wherein the interconnection holes (IH) pass through the thinner substrate (Sub') and the second planar structure (S2), the recessed planar structure (Se) being the second planar structure (S2), the recesses being produced in the thinner substrate (Sub') and the second planar structure (S2).

16. An optoelectronic display system as claimed in claim 1, comprising a matrix of light-emitting pixels (Matel),
wherein the first functionality is a pixelized emission, the first planar structure (S1) comprising a plurality of layers including a light-emitting layer,
wherein the second functionality is a generation of electrical signals suitable for producing the light emission, the second planar structure (S2) comprising an addressing circuit (AC) for the pixels which is deposited on a silicon substrate, and wherein the at least one active zone (Zact) comprises said matrix of pixels (Matel) and the at least one neutral zone (Zn) is disposed at the periphery of said matrix of pixels, the recessed structure (Se) corresponding to the first planar structure (S1).

17. An electronic system as claimed in claim 1, wherein the first planar structure (S1) comprises a plurality of transistors (T) and the second planar structure comprises circuits (Circ) associated with said transistors, and wherein the at least one active zone (Zact) comprises said transistors and the at least one neutral zone (Zn) is disposed at the periphery of said transistors, the recessed structure (Se) corresponding to the first planar structure (S1).

18. The system as claimed in claim 16, further comprising interconnection vias (CV) in the active zone.

19. A method for fabricating a hybrid optical and/or hybrid electronic system, the method comprising the steps of:
assembling, by an assembly layer, a first planar structure (S1) having a first functionality produced in at least one first material (M1), the first structure (S1) being deposited on a first substrate (Sub1), and a second planar structure (S2) having a second functionality produced in at least one second material (M2) that is different from the first material, the second structure (S2) being deposited on a second substrate (Sub2),
the first and second assembled structures comprising at least one active zone (Zact) used to implement said functionalities, and at least one neutral zone (Zn) not used to implement said functionalities,
detaching one of the substrates so as to retain only a single rigid substrate (Sub1, Sub2),
producing recesses (Ev) in at least one neutral zone (Zn) of the planar structure which is not disposed on the rigid substrate, called recessed planar structure (Se).

20. The method as claimed in claim 19, further comprising a step of replacement of the remaining substrate with a destination substrate (Subd).

21. The fabrication method as claimed in claim 19 for fabricating a hybrid optoelectronic detector comprising a matrix of pixels (Matd), the first functionality being a pixelized photogeneration of carriers, the first structure (S1) comprising a plurality of layers including an absorbent layer (AL) made of II-VI or III-V semiconductor material,
the second functionality being a read-out of a signal generated by a pixel, the second structure (S2) comprising a read-out circuit (ROIC) intended to recover an electrical signal from said carriers photogenerated by the absorbent layer (AL) and comprising a plurality of buried contacts (TLC),
the at least one active zone (Zact) comprising the matrix of pixels, and the at least one neutral zone (Zn) being disposed at the periphery of said matrix of pixels,
the step of production of the recesses consisting in simultaneously producing interconnection holes (IH) in the at least one active zone (Zact) through one of the planar structures, and said recesses (Ev) in the at least one neutral zone (Zn) of said planar structure passed through by the interconnection holes.

22. The fabrication method as claimed in claim 19 for fabricating a hybrid optoelectronic detector, further comprising the steps of:
producing a plurality of doped zones (DZ) configured to collect carriers photogenerated by the absorbent layer, a doped zone making it possible to define a pixel (Pix) of the detector,
electrically connecting each doped zone (DZ) with the associated contact (TLC) of the read-out circuit (ROIC) via the interconnection holes (IH).

23. The method as claimed in claim 21, wherein the step of simultaneous production of the interconnection holes and of the recesses is performed by etching of the first planar structure (S1) and, for the interconnection holes, of the read-out circuit (ROIC) to the buried contacts (TLC), the recessed planar structure corresponding to the first planar structure.

24. The method as claimed in claim 21, wherein the step of simultaneous production of the interconnection holes and of the recesses is performed by etching of the thinner substrate (Sub') on which the read-out circuit is deposited and at least partially of the read-out circuit (ROIC), the recessed planar structure corresponding to the second structure.

25. The method as claimed in claim 21, wherein the step of simultaneous production of the interconnection holes (IH) and of the recesses (Ev) is performed by lithography then etching, the lithography technology being chosen from among: electron beam; nano-printing; optical lithography, and the etching technology being chosen from among ion etching, chemical or plasma etching, etc.

\* \* \* \* \*